(12) United States Patent
Wu

(10) Patent No.: US 8,710,723 B1
(45) Date of Patent: Apr. 29, 2014

(54) ALL-ANGLE LIGHT EMITTING ELEMENT HAVING HIGH HEAT DISSIPATING EFFICIENCY

(71) Applicant: Unity Opto Technology Co., Ltd., New Taipei (TW)

(72) Inventor: Ching-Huei Wu, New Taipei (TW)

(73) Assignee: Unity Opto Technology Co., Ltd., New Taipei (TW)

( * ) Notice: Subject to any disclaimer, the term of this patent is extended or adjusted under 35 U.S.C. 154(b) by 0 days.

(21) Appl. No.: 13/919,109

(22) Filed: Jun. 17, 2013

(30) Foreign Application Priority Data

Mar. 15, 2013 (TW) .............................. 102204747 U

(51) Int. Cl.
*H01J 1/02* (2006.01)

(52) U.S. Cl.
USPC ............................................ 313/46; 362/326

(58) Field of Classification Search
USPC .......................................................... 313/46
See application file for complete search history.

(56) References Cited

U.S. PATENT DOCUMENTS

| | | | |
|---|---|---|---|
| 2007/0139949 A1* | 6/2007 | Tanda et al. | 362/551 |
| 2011/0074296 A1* | 3/2011 | Shen et al. | 315/112 |
| 2012/0146503 A1* | 6/2012 | Negley et al. | 315/35 |
| 2013/0049031 A1* | 2/2013 | Matsuda et al. | 257/88 |
| 2013/0064260 A1* | 3/2013 | Tanda et al. | 372/43.01 |

* cited by examiner

*Primary Examiner* — Mary Ellen Bowman

(74) *Attorney, Agent, or Firm* — Rosenberg, Klein & Lee

(57) ABSTRACT

Disclosed is an all-angle light emitting element having high heat dissipating efficiency. The all-angle light emitting element has a transparent substrate, at least one light emitting chip, at least one heat dissipating rib and thermal glue. The transparent substrate has a chip fixing area with an area A. The heat dissipating rib is attached onto the transparent substrate, and the heat dissipating rib has a heat dissipating section and a heat source contact section, and the heat source contact section has an area B, and 3%≤B/A≤26%. The heat dissipating section and the heat source contact section of the heat dissipating rib can effectively conduct the heat generated by an optical chip and provide a 360-degree all-angle light emission.

8 Claims, 5 Drawing Sheets

ALL-ANGLE LIGHT EMITTING ELEMENT HAVING HIGH HEAT DISSIPATING EFFICIENCY

CROSS-REFERENCE TO RELATED APPLICATIONS

This non-provisional application claims priority under 35 U.S.C. §119(a) on Patent Application No(s). 102204747 filed in Taiwan, R.O.C. on Mar. 15, 2013, the entire contents of which are hereby incorporated by reference.

BACKGROUND OF THE INVENTION

1. Field of the Invention

The present invention relates to a light emitting element, and more particularly to an all-angle light emitting element capable of dissipating heat generated by an optical chip effectively and providing a 360-degree all-angle light emission.

2. Description of the Related Art

As the industry of light emitting diode (LED) blooms, the LED has become the most popular light emitting element in the field of illumination. However, the LED generates a large quantity of heat during its light emitting process, and if there is no appropriate heat dissipation, the LED will be overheated and cause lower brightness. When the temperature of LED exceeds 100, the LED and its packaging material will deteriorate, thus causing damages to the light emitting chip and shortening the life of the LED.

As we all know, heat is transmitted via conduction, convection and radiation. Conduction is suitable for solid media. In general, metals and ceramics have better thermal conductivity. If the conductive area of an object is large, the thermal conduction effect will be improved. Convection and radiation are suitable for liquid and gas media. Regarding heat convection, heat can be transmitted from a place with a higher temperature to a place with a lower temperature; and regarding heat radiation, heat can be transmitted via electromagnetic waves. The common heat dissipation methods of LED lamps include increasing the heat dissipating area, using a better thermally conductive material, adding heat dissipating blocks, and installing fans. However, these methods still have drawbacks. For example, the installation of additional heat dissipation blocks or fans incurs a higher cost and requires a manufacturing process to assemble the heat dissipation blocks with the LED as a whole, thus increasing the manufacturing time and cost. If the heat dissipating area is increased, the overall size of a design will be restricted and the choice of material will be relatively more difficult while taking the cost into consideration.

In addition, a conventional LED chip adopts a sapphire substrate with a thermal conductivity of approximately 20 W/mK only and thus it has difficulties to dissipate the heat generated by epitaxial layers to the outside quickly, and the LED is usually packaged by wire bonding. As a result, the speed of conducting heat is very slow when compared with the metal substrate or sapphire substrate, so that the heat source will be conducted from the metal and the heat dissipation effect will be poor.

Therefore, it is an urgent and important subject for related manufacturers to provide an all-angle light emitting element having high heat dissipating efficiency for effectively dissipating the heat generated by the LED chips on the transparent substrate without blocking the light emitted from the LED chip in order to obtain a 360-degree all-angle light source.

SUMMARY OF THE INVENTION

In view of the aforementioned problems of the prior art, it is a primary objective of the present invention to overcome the problems by providing an all-angle light emitting element having high heat dissipating efficiency, and the all-angle light emitting element comprises a heat dissipating rib having a heat dissipating section and a heat source contact section and capable of effectively conducting the heat generated by an optical chip without blocking the light emitted by the light emitting chip to provide a 360-degree all-angle light source.

To achieve the aforementioned objective, the present invention provides an all-angle light emitting element having high heat dissipating efficiency comprising a transparent substrate, at least one light emitting chip, at least one heat dissipating rib and thermal glue. Wherein, the transparent substrate has a chip fixing area with an area A; the light emitting chip is installed on the chip fixing area; the heat dissipating rib is attached onto the transparent substrate, and the heat dissipating rib is a plate like structure having a heat dissipating section and a heat source contact section, and the heat source contact section of the heat dissipating rib is disposed adjacent to the chip fixing area, wherein the heat source contact section has an area B, and $3\% \leq B/A \leq 26\%$; and the thermal glue is covered onto the chip fixing area and the heat dissipating rib to seal the chip fixing area and the heat dissipating rib.

In another preferred embodiment, the all-angle light emitting element having high heat dissipating efficiency of the present invention further comprises a first fluorescence powder layer and a second fluorescence powder layer, wherein the first fluorescence powder layer is disposed under the transparent substrate, and the second fluorescence powder layer is disposed above the thermal glue, the light emitting chip and the heat dissipating rib, so that the transparent substrate, the thermal glue, the light emitting chip and the heat dissipating rib are disposed between the first fluorescence powder layer and the second fluorescence powder layer.

Wherein, the light emitting chip is a monocrystalline dual light source chip, and the heat dissipating rib is made of metal.

In the all-angle light emitting element having high heat dissipating efficiency, the thermal glue is a solder paste.

DETAILED DESCRIPTION OF THE PREFERRED EMBODIMENTS

The technical content of the present invention will become apparent with the detailed description of preferred embodiments and the illustration of related drawings as follows.

Figure 1:
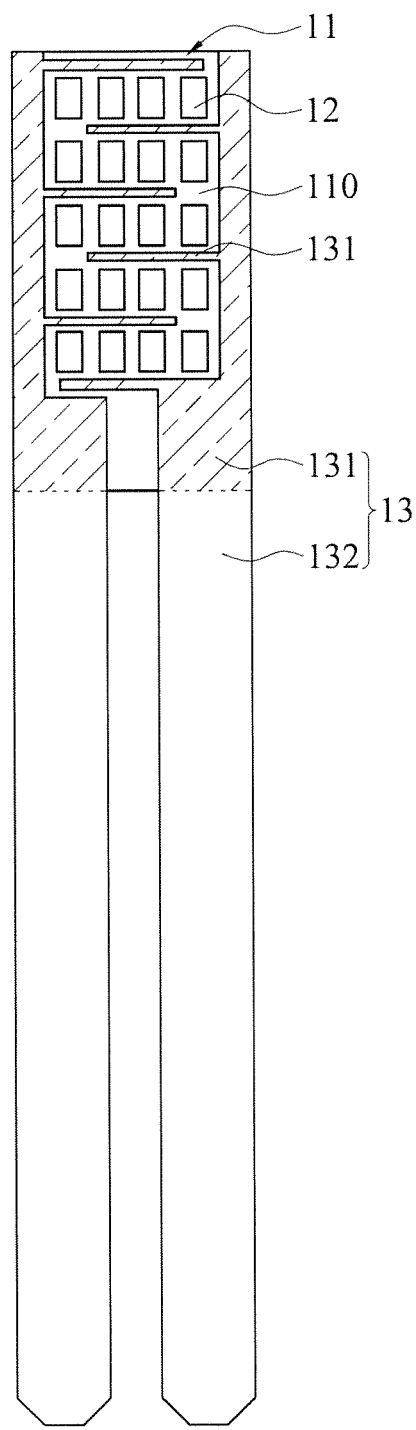
FIG. 1 is a first schematic view of an all-angle light emitting element having high heat dissipating efficiency in accordance with a first preferred embodiment of the present invention.
Figure 2:
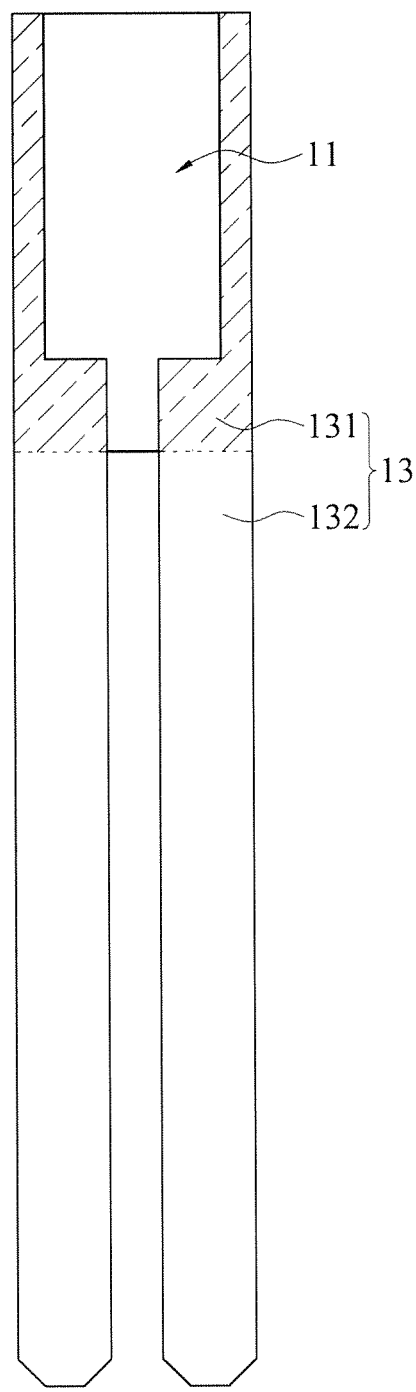
FIG. 2 is a second schematic view of an all-angle light emitting element having high heat dissipating efficiency in accordance with the first preferred embodiment of the present invention.
Figure 3:
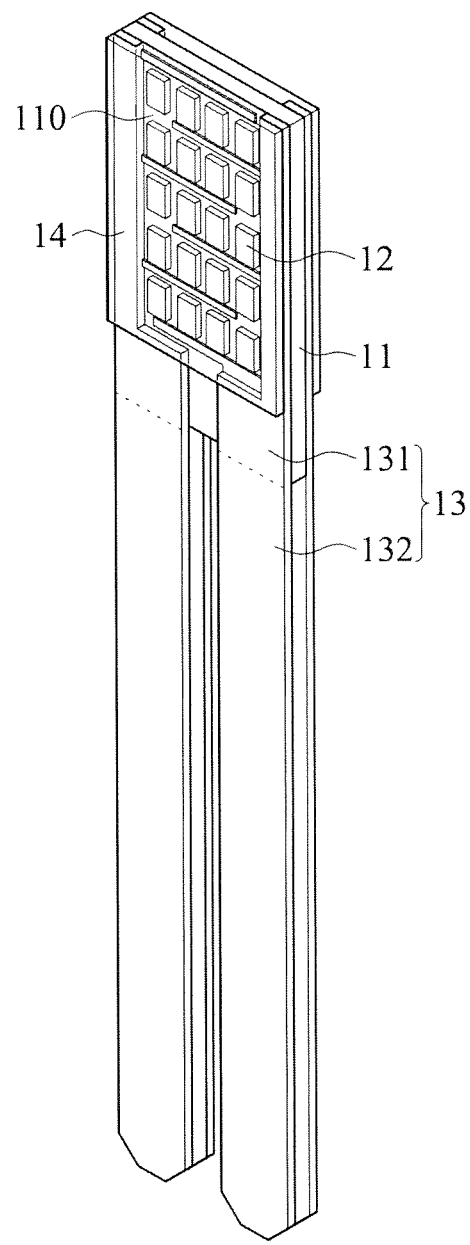
FIG. 3 is a perspective view of an all-angle light emitting element having high heat dissipating efficiency in accordance with the first preferred embodiment of the present invention.

With reference to FIGS. 1 to 3 for the first and second schematic views and a perspective view of an all-angle light emitting element having high heat dissipating efficiency in accordance with the first preferred embodiment of the present invention respectively. FIG. 1 shows a front view of the all-angle light emitting element 1 of the present invention; FIG. 2 shows a rear view of the all-angle light emitting element 1 of the present invention. The all-angle light emitting element 1 comprises a transparent substrate 11, at least one light emitting chip 12, at least one heat dissipating rib 13 and a thermal glue 14. Wherein, the transparent substrate 11 has a chip fixing area 110 with an area A. and the light emitting chip 12 is installed on the chip fixing area 110. The light emitting chip 12 is a monocrystal line structure. A monochrome light source is emitted from either one or both sides. In other words, the transparent substrate 11 of the all-angle light emitting element 1 of the present invention is combined with the light emitting chip 12 having dual light sources and the heat dissipating rib 13 to form an all-angle light emitting element 1 emitting all-angle light.

The heat dissipating rib 13 is a plate like structure attached onto the transparent substrate 11 and having a heat dissipating section 132 and a heat source contact section 131. The heat source contact section 131 is disposed adjacent to the chip fixing area 110, and the heat source contact section 131 has an area B. In addition, the area of the chip fixing area 110 and the area of the heat source contact section 131 satisfy the relation of $3\% \leq B/A \leq 26\%$. The heat dissipating rib 13 is preferably made of metal or metal alloy. It is noteworthy that the heat dissipating section 132 of the all-angle light emitting element 1 of the present invention has a length or an area that can be adjusted according to actual requirements.

As shown in the figures, the heat dissipating rib 13 is attached onto the transparent substrate 11 directly, so that the high heat generated by the light emitting chip 12 installed on the chip fixing area 110 of the transparent substrate 11 can be conducted to the heat source contact section 131 of the heat dissipating rib 13, and then to the heat dissipating section 132 for heat dissipation. In addition, the heat source contact section 131 of the heat dissipating rib 13 has a plurality of comb-like protrusions attached onto the periphery of the chips 12. Since the distance from the light emitting chip 12 to the heat dissipating section 132 is very short, the heat dissipating path is the shortest and most direct path; and the all-angle light emitting element 1 of the present invention has the best heat dissipating efficiency.

Meanwhile, to enhance the thermal conducting efficiency of the all-angle light emitting element 1 of the present invention, the all-angle light emitting element 1 is further applied with thermal glue 14 to cover the chip fixing area 110 and the heat dissipating rib 13 in order to seal the chip fixing area 110 and the heat dissipating rib 13. Since the thermal glue 14 is transparent, the light produced by the light emitting chip 12 will not be blocked or affected, and the all-angle light emitting element 1 of the present invention can provide a better light emitting effect.

In addition, the heat dissipating rib 13 of the all-angle light emitting element 1 of the present invention may be made of metal, improving the thermal conductivity of the heat dissipating rib 13 of the present invention.

Figure 4:
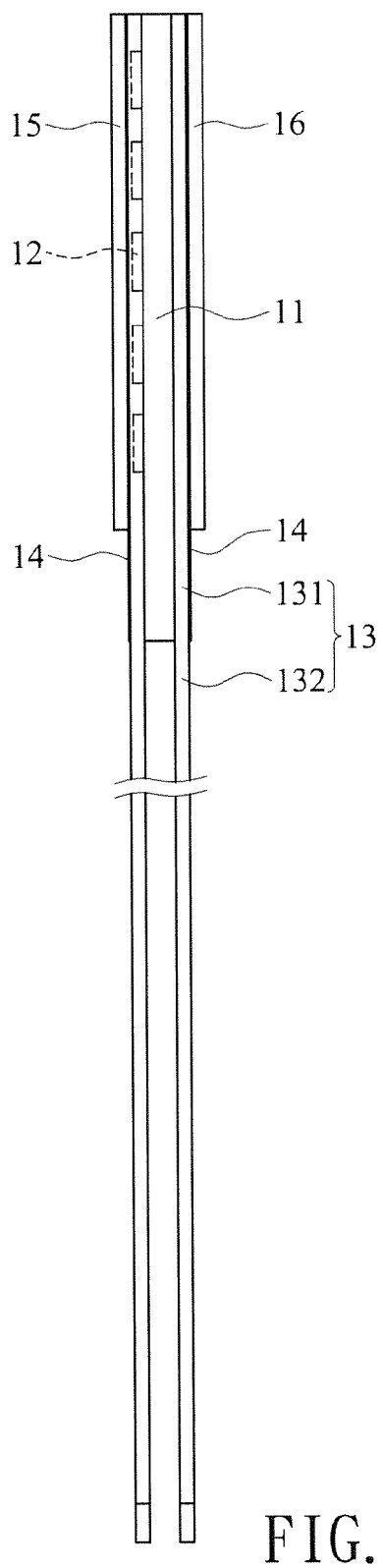
FIG. 4 is a cross-sectional view of an all-angle light emitting element having high heat dissipating efficiency in accordance with a second preferred embodiment of the present invention.

FIG. 4 is a cross-sectional view of an all-angle light emitting element having high heat dissipating efficiency in accordance with the second preferred embodiment of the present invention. As shown in the figure, the difference between this embodiment and the first preferred embodiment resides on that an all-angle light emitting element 2 further comprises a first fluorescence powder layer 15 and a second fluorescence powder layer 16, so as to produce lights of different wavelengths.

Wherein, the first fluorescence powder layer 15 is disposed on a side of the transparent substrate 11, and the second fluorescence powder layer 16 is disposed on a side opposite to the side on which the thermal glue 14, the light emitting chip 12 and the heat dissipating rib 13 are disposed; in turn, the transparent substrate 11, the thermal glue 14, the light emitting chip 12 and the heat dissipating rib 13 are disposed between the first fluorescence powder layer 15 and the second fluorescence powder layer 16. In addition, the light emitting chip 12 may be a monocrystalline structure, in particular, a monocrystalline dual light source chip capable of emitting light of different wavelengths from both top and bottom sides to the first fluorescence powder layer 15 and the second fluorescence powder layer 16 to activate and produce a filtered light source. Wherein, the thermal glue is a solder paste capable of improving heat dissipating performance of the all-angle light emitting element 2 of the present invention.

The transparent substrate 11 is made of a material selected from the group of silicon dioxide (SiO2), gallium phosphide (GaP), silicon carbide (SiC), aluminum gallium arsenide (AlGaAs) and sapphire.

Figure 5:
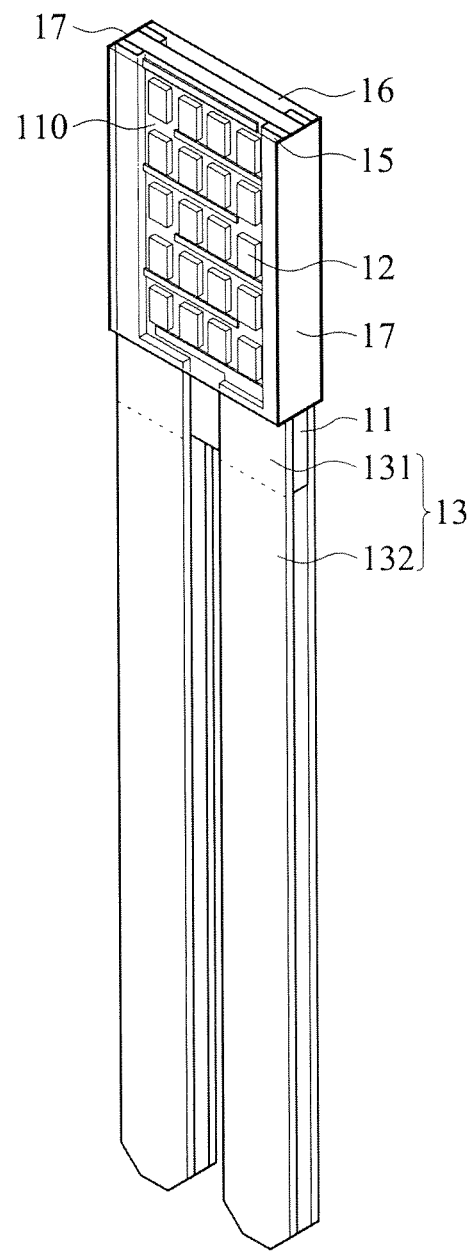
FIG. 5 is a perspective view of an all-angle light emitting element having high heat dissipating efficiency in accordance with a third preferred embodiment of the present invention.

FIG. 5 is a perspective view of an all-angle light emitting element in accordance with the third preferred embodiment of the present invention. The difference between the current preferred embodiment and the second preferred embodiment resides on that an all-angle light emitting element 3 may further comprise a third fluorescence powder layer 17 disposed on both left and right sides where the transparent substrate 11, the thermal glue 14, the light emitting chip 12 and the heat dissipating rib 13 are located; so that when a small portion of the light source is projected from both left and right sides, the light passing through the third fluorescence powder layer 17 is excited to produce a different wavelength of light.

What is claimed is:

1. An all-angle light emitting element having high heat dissipating efficiency, comprising:
   a transparent substrate, having a chip fixing area with an area A;
   at least one light emitting chip, installed on the chip fixing area;
   at least one heat dissipating rib, attached onto the transparent substrate, and the heat dissipating rib being a plate like structure having a heat dissipating section and a heat source contact section, and the heat source contact section of the heat dissipating rib being disposed adjacent to the chip fixing area, wherein the heat source contact section has an area B, and $3\% \leq B/A \leq 26\%$; and
   a thermal glue, covered onto the chip fixing area and the heat dissipating rib to seal the chip fixing area and the heat dissipating rib.

2. The all-angle light emitting element having high heat dissipating efficiency according to claim 1, wherein the thermal glue is a solder paste.

3. The all-angle light emitting element having high heat dissipating efficiency, according to claim 1, further comprising:
   a first fluorescence powder layer and a second fluorescence powder layer, wherein the first fluorescence powder layer is disposed under the transparent substrate, and the second fluorescence powder layer is disposed above the thermal glue, the light emitting chip and the heat dissipating rib, so that the transparent substrate, the thermal glue, the light emitting chip and the heat dissipating rib are disposed between the first fluorescence powder layer and the second fluorescence powder layer.

4. The all-angle light emitting element having high heat dissipating efficiency according to claim 3, wherein the thermal glue is a solder paste.

5. The all-angle light emitting element having high heat dissipating efficiency according to claim 1, wherein the light emitting chip is a monocrystalline dual light source chip.

6. The all-angle light emitting element having high heat dissipating efficiency according to claim 5, wherein the thermal glue is a solder paste.

7. The all-angle light emitting element having high heat dissipating efficiency according to claim 1, wherein the heat dissipating rib is made of metal.

8. The all-angle light emitting element having high heat dissipating efficiency according to claim 7, wherein the thermal glue is a solder paste.

* * * * *